United States Patent
Chen et al.

(10) Patent No.: US 7,916,519 B2
(45) Date of Patent: Mar. 29, 2011

(54) BURN-IN METHODS FOR STATIC RANDOM ACCESS MEMORIES AND CHIPS

(75) Inventors: Jui-Lung Chen, Hsinchu (TW); Wei-Shung Chen, Hsinchu County (TW); Yi-Hsun Chung, Miaoli County (TW); Chia-Chiuan Chang, Miaoli County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 91 days.

(21) Appl. No.: 12/368,218

(22) Filed: Feb. 9, 2009

(65) Prior Publication Data

US 2010/0202219 A1   Aug. 12, 2010

(51) Int. Cl.
*G11C 11/00* (2006.01)
(52) U.S. Cl. ............... 365/156; 365/189.05; 365/201
(58) Field of Classification Search ............... 365/156, 365/201, 208, 207
See application file for complete search history.

(56) References Cited

U.S. PATENT DOCUMENTS

| | | | | |
|---|---|---|---|---|
| 5,559,745 | A * | 9/1996 | Banik et al. | 365/201 |
| 6,205,067 | B1 * | 3/2001 | Tsukude | 365/201 |
| 6,414,889 | B1 * | 7/2002 | Chen et al. | 365/201 |
| 6,437,590 | B1 * | 8/2002 | Tatsumi | 324/763 |
| 6,501,692 | B1 * | 12/2002 | Melanson et al. | 365/201 |
| 7,042,780 | B2 * | 5/2006 | Lee | 365/203 |
| 7,079,433 | B1 * | 7/2006 | Chen et al. | 365/201 |

* cited by examiner

*Primary Examiner* — Connie C Yoha

(57) ABSTRACT

A burn-in method for SRAMs and chips. For a memory cell of the SRAM, the SRAM burn-in method controls the control signals of the memory cell to generate current paths to pass through the memory cell, the corresponding bit-line and the corresponding bit-line-bar. The contacts/vias in the current paths are tested by providing burn-in currents to flow through the current paths, so that mismatched contacts/vias are burned by the burn-in currents. SRAMs that fail the burn-in test are abandoned after the burn-in procedure.

8 Claims, 3 Drawing Sheets

BURN-IN METHODS FOR STATIC RANDOM ACCESS MEMORIES AND CHIPS

BACKGROUND OF THE INVENTION

1. Field of the Invention

The present invention relates to burn-in methods for chips, and in particular relates to burn-in methods for Static Random Access Memories (SRAMs).

2. Description of the Related Art

For ensuring lifespan of chips, a burn-in procedure is required for chip manufacturing. The burn-in procedure verifies the robustness of the chips manufactured. Poor quality chips may be destroyed during the burn-in procedure. The destroyed poor quality chips will be identified later, thus insuring good quality chips to clients of chip manufacturers.

Sub-micron level chip manufacturing processes (smaller than 1.8 um) may result in mismatched contacts/vias in the manufactured chip. Mismatched contacts/vias cause poor chip circuit contacts. Poor contacts decrease lifespan of chips. Specifically, a chip may malfunction before its warranty expires.

Burn-in methods capable of determining chips with poor contacts are called for.

BRIEF SUMMARY OF THE INVENTION

The invention discloses burn-in methods for SRAMs and chips.

The SRAM burn-in methods of the invention can be applied in several kinds of SRAMs. An SRAM typically comprises a plurality of memory cells. Each memory cell relates to a word line, a bit-line, and a bit-line-bar. The signal on the word line determines coupling between the memory cell and the bit-line and coupling between the memory cell and the bit-line-bar. The SRAM burn-in method of the invention controls the control signals of the memory cell to form current paths passing the bit-line, bit-line-bar and the memory cell. Electric currents are provided to flow through the current paths to destroy poor quality contacts/vias in the current paths. The burn-in methods of the invention may be applied in determining mismatched contacts/vias in an SRAM.

When the burn-in method is applied to verifying the robustness of a chip, several current paths passing the contacts/vias of the chip are provided. After heavy currents flow through the current paths, mismatched contacts/vias are destroyed. The burn-in method may be applied to determine mismatched contacts/vias in the chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description show several embodiments carrying out the invention. This description is made for the purpose of illustrating the general principles of the invention and should not be taken in a limiting sense. The scope of the invention is best determined by reference to the appended claims.

Figure 1:
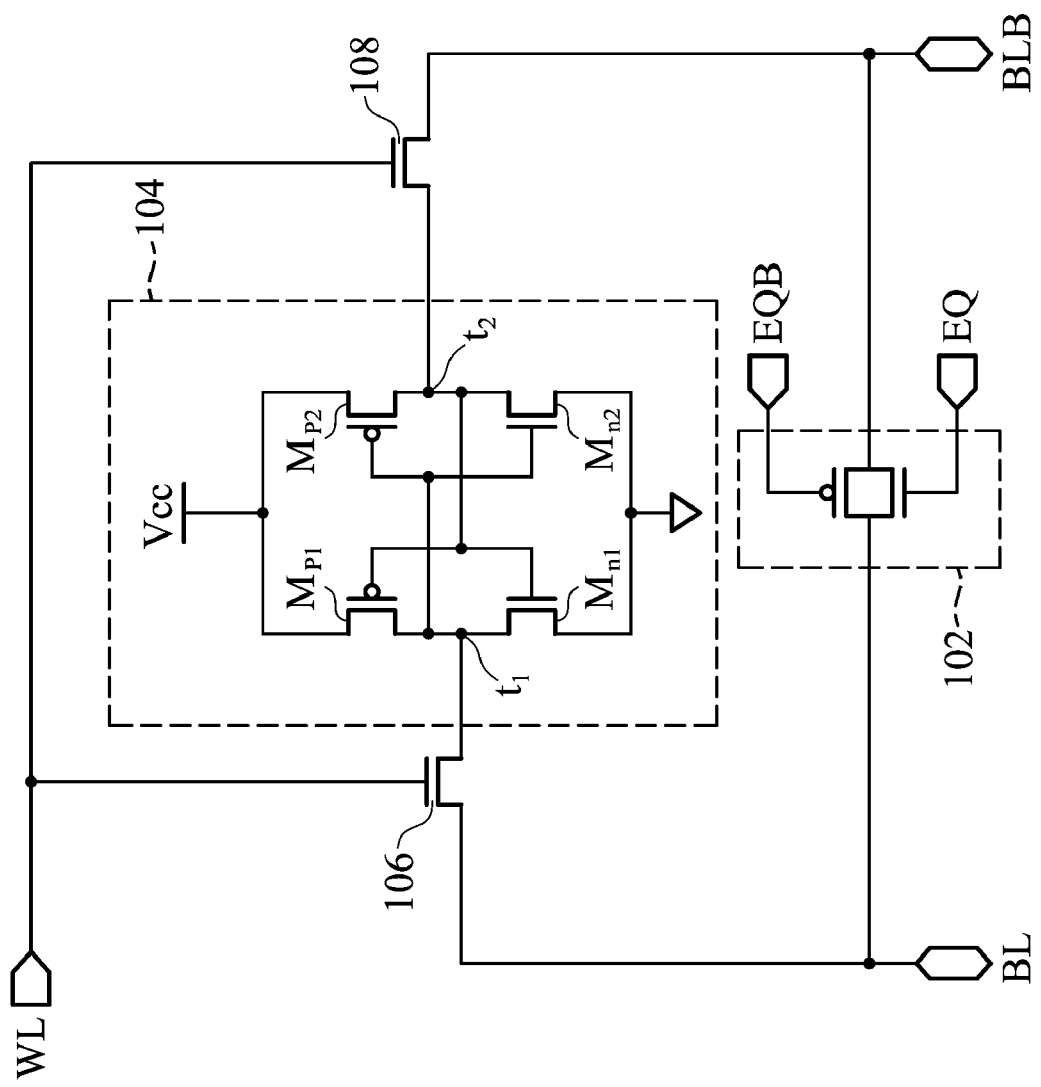
FIG. 1 depicts an embodiment of an SRAM.

FIG. 1 depicts an exemplary embodiment of an SRAM, which comprises a memory cell, a word line WL, a bit-line BL, a bit-line-bar BLB, and an equalizing circuit 102. The memory cell comprises a latch 104, a first transmission gate 106 and a second transmission gate 108. The latch 104 is formed by two inverters and is capable of storing digital data such as digital data '1' or '0'. One of the inverters is composed of transistors $M_{p1}$ and $M_{n1}$, and the another one is composed of transistors $M_{p2}$ and $M_{n2}$. Compared with a dynamic random access memory (DRAM) which periodically refreshes stored data, the latching function of the SRAM allows stable data storage that does not need to be periodically refreshed. The latch 104 has a first terminal $t_1$ and a second terminal $t_2$. Between the first terminal $t_1$ and the bit-line BL is the first transmission gate 106. Between the second terminal $t_2$ and the bit-line-bar BLB is the second transmission gate 108. The word line WL is for controlling the first and second transmission gates 106 and 108. The equalizing circuit 102, controlled by signals EQ and EQB, is for connecting the bit-line BL with the bit-line-bar BLB before a read operation. Thus, before the read operation, the short-circuited bit-line BL and bit-line-bar BLB are capable to be pre-charged to a predetermined voltage level by a bit-line load (not shown in the figure).

The following paragraphs describe an exemplary embodiment of the burn-in methods of the invention, wherein the burn-in method is applied in the circuit shown in FIG. 1. The SRAM burn-in method may first set the first and second terminals $t_1$ and $t_2$ of the latch 104 to a high voltage level and a low voltage level, respectively, by storing a digital data '1' to the memory cell. Then, the burn-in method enables the equalizing circuit 102 to connect the bit-line BL and the bit-line-bar BLB and controls the signal on the word line WL to turn on the first and second transmission gates 106 and 108. The high voltage level at the first terminal $t_1$ and the low voltage level at the second terminal $t_2$ turn on the transistors $M_{p1}$ and $M_{n2}$ and turn off the transistors $M_{p2}$ and $M_{n1}$. Thus, a first current path, from the voltage source $V_{cc}$ to the transistor $M_{p1}$ to the first transmission gate 106 to the bit-line BL to the equalizing circuit 102 to the second transmission gate 108 to the transistor $M_{n2}$ and finally to the ground, is generated. An electric current is provided to flow through the first current path, and the contacts/vias in the first current path are tested. The current burns the mismatched contacts/vias in the first current path, and destroyed SRAM are extracted before being packaged.

The aforementioned technique only protects a portion of the contacts/vias of the memory cell shown in FIG. 1. For verification of the remaining contacts/vias of the memory cell shown in FIG. 1, the burn-in methods of the invention further provide a second current path. To establish the second current path, the first and second terminals $t_1$ and $t_2$ are set to a low voltage level and a high voltage level, respectively, by storing a digital data '0' to the memory cell. Then, the burn-in method enables the equalizing circuit 102 to connect the bit-line BL with the bit-line-bar BLB and controls the signal on the word line WL to turn on the first and second transmission gates 106 and 108. The low voltage level at the first terminal $t_1$ and the high voltage level at the second terminal $t_2$ turn on the transistors $M_{p2}$ and $M_{n1}$ and turn off the transistors $M_{p1}$ and $M_{n2}$. Thus, the second current path, from the voltage source $V_{cc}$ to the transistor $M_{p2}$ to the second transmission gate 108 to the bit-line-bar BLB to the equalizing circuit 102 to the first transmission gate 106 to the transistor $M_{n1}$ and finally to the ground, is generated. A electric current is provided to flow through the second current path, and the contacts/vias in the second current path are tested. The current burns the mismatched contacts/vias in the second current path, and destroyed SRAM are extracted before being packaged.

In another exemplary embodiment, the first and second current paths may be tested in a reverse order. For example, the contacts/vias in the second current path (from the voltage source $V_{cc}$ to the transistor $M_{p2}$ to the second transmission gate 108 to the bit-line-bar BLB to the equalizing circuit 102 to the first transmission gate 106 to the transistor $M_{n1}$ and finally to the ground) may be tested prior to the contacts/vias in first current path (from the voltage source $V_{cc}$ to the transistor $M_{p1}$ to the first transmission gate 106 to the bit-line BL to the equalizing circuit 102 to the second transmission gate 108 to the transistor $M_{n2}$ and finally to the ground). In such an embodiment, a digital data '0' is first stored in the memory cell for testing the contacts/vias in the second current path and, after the second current path testing, a digital data '1' is stored in the memory cell for testing the contacts/vias in the first current path. The order for testing does not limit the scope of the invention.

To reduce the required time of the burn-in procedure, the invention further discloses techniques which burn several memory cells of the same word line simultaneously. When considering the current loading of the word line, the burn-in method of the invention may control the voltage level of the word line to be just slightly greater than a threshold voltage $V_{tn}$ of the first and second transmission gates 106 and 108 (wherein the voltage difference between the word line and the threshold voltage $V_{tn}$ may be limited within a predetermined range). The control of the word line WL limits the electronic conduction of the first and second transmission gates 106 and 108. Thus, the burn-in current is limited within a proper range, and a reasonable current loading is provided to the word line WL that is driving more than one memory cells.

The aforementioned control scheme of the word line WL (setting the voltage level of the word line WL to be just slightly greater than the threshold value $V_{tn}$ during the burn-in procedure) can further prevent the data latched in the latch 104 from being improperly reversed. The data reversal during the burn-in procedure may cause repeated testing of a specific portion of the contacts/vias of the memory cell and cause testing of the other contacts/vias of the memory cell to be omitted. The control of the word line WL can avoid repeated testing.

The invention further discloses several severer burn-in methods. One of them is increasing the voltage level of the voltage source $V_{cc}$ during the burn-in procedure (to be greater than a normal voltage level for normal read/write operations). In another exemplary embodiment, the burn-in period is extended. These techniques use heavier energy to verify the chips or SRAMs. The chips or SRAMs who pass the testing usually have remarkable robustness.

Figure 2:
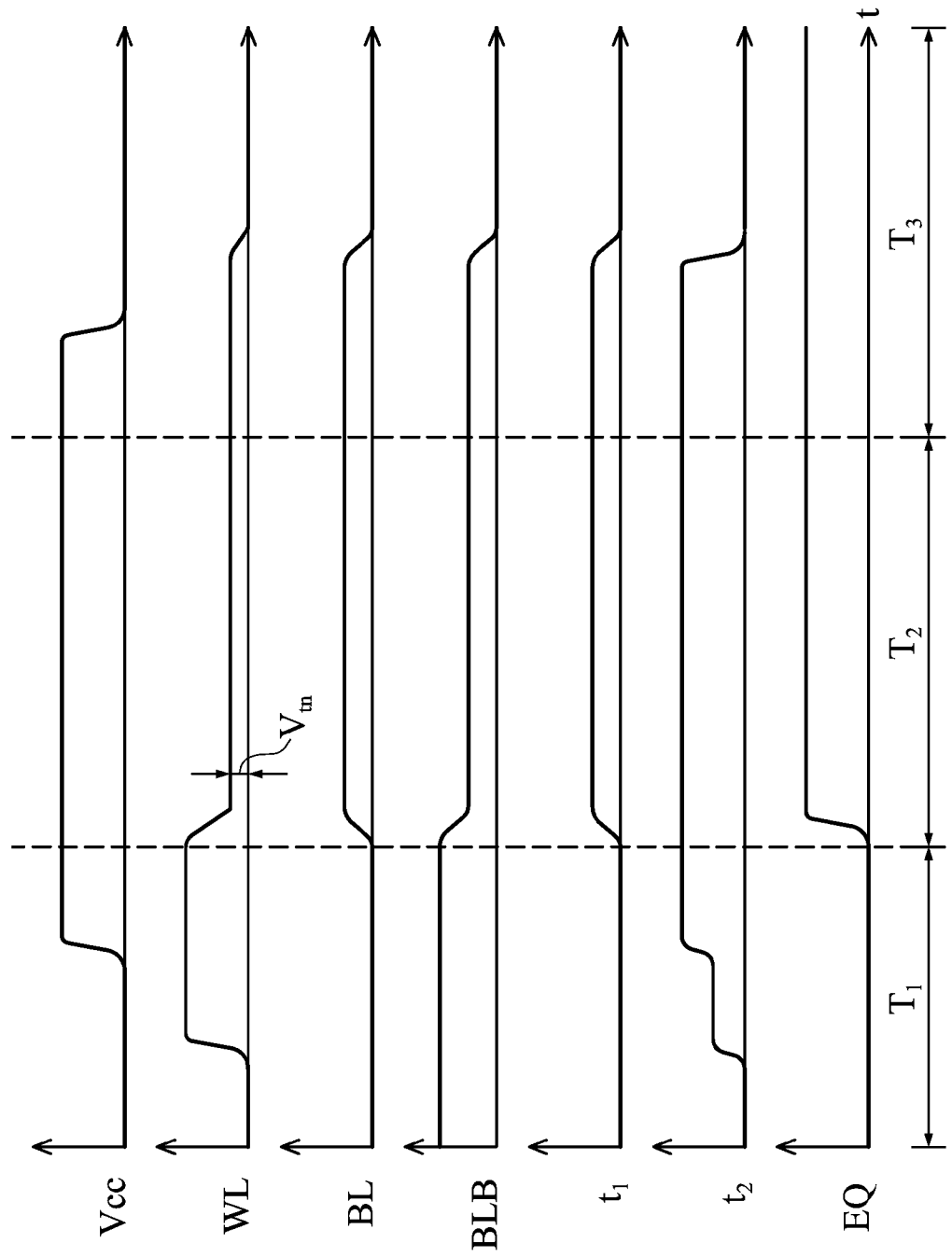
FIG. 2 shows voltage levels of several terminals of FIG. 1 when an exemplary embodiment of the burn-in methods of the invention is applied in the circuit of FIG. 1.

FIG. 2 depicts voltage levels of some specific terminals of the circuit shown in FIG. 1, wherein the aforementioned second current path, from the voltage source $V_{cc}$ to the transistor $M_{p2}$ to the second transmission gate 108 to the bit-line-bar BLB to the equalizing circuit 102 to the bit-line BL to the first transmission gate 106 to the transmitter $M_{n1}$ and finally to the ground, is generated. The burn-in procedure for the second current path may be divided into a three time periods $T_1$, $T_2$ and $T_3$.

In the first period $T_1$, digital data '0' is written to the memory cell. As shown, first, the voltage levels of the bit-line BL and the bit-line-bar BLB are set to a low voltage level and a high voltage level, respectively. Then, the voltage level of the word line WL is raised for turning on the first and second transmission gates 106 and 108, and the voltage levels of the bit-line BL and the bit-line-bar are transmitted to the first terminal $t_1$ and the second terminal $t_2$ of the latch 104, respectively. Furthermore, the voltage source $V_{cc}$ of the latch 104 is powered on to latch data '0' at the first terminal $t_1$ and to latch data '1' at the second terminal $t_2$. Digital data '0' is stored in the memory cell at the end of the first time period $T_1$.

During the second time period $T_2$, the burn-in current path, from the voltage source $V_{cc}$ to the transistor $M_{p2}$ to the second transmission gate 108 to the bit-line-bar BLB to the equalizing circuit 102 to the bit-line BL to the first transmission gate 106 to the transmitter $M_{n1}$ and finally to the ground, is generated. In the second time period $T_2$, the control signal EQ of the equalizing circuit 102 is raised to generate a short circuit between the bit-line BL and the bit-line-bar BLB, so that the bit-line BL and the bit-line-bar BLB are led to the same voltage level. The waveform of the voltage level of the first terminal $t_1$ is slightly raised during the second time period $T_2$ due to the impedance of the transistor $M_{n1}$. In some cases, to prevent reversal of the first and second terminals $t_1$ and $t_2$ by an overlarge voltage level at the word line WL, the burn-in technique of the invention may further limit the voltage level of the word line WL to be just slightly greater than a threshold value $V_{tn}$ during the second time period $T_2$.

In the third time period $T_3$, the memory cell is shut down, completing the second current path burn-in procedure.

The waveforms of FIG. 2 just show an exemplary embodiment of the invention, and does not intend to limit the scope of the invention.

Figure 3:
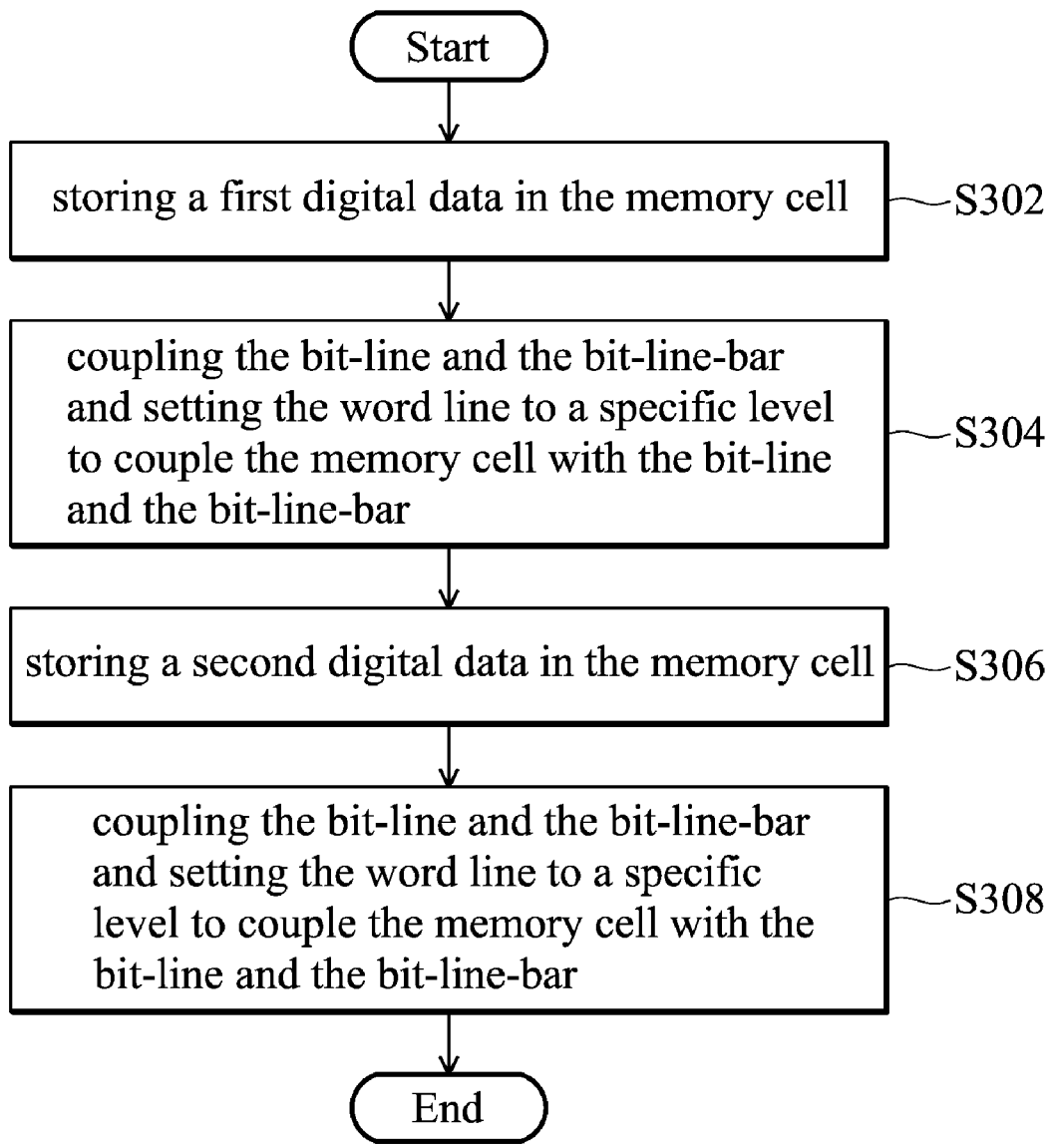
FIG. 3 shows a flowchart of the SRAM burn-in procedure of the invention.

The burn-in procedure of the invention can be applied in other types of SRAMs. A memory cell of an SRAM is typically controlled by a word line, a bit-line and a bit-line-bar. The connection between the memory cell, the bit-line and the bit-line-bar is dependent on the voltage level of the word line. FIG. 3 shows a flowchart of the SRAM burn-in procedure of the invention. In step S302, a first digital data is stored in the memory cell. In step S304, the bit-line and the bit-line-bar are coupled together, and the word line is set to a specific level to couple the memory cell with the bit-line and the bit-line-bar. Then, a first current path is generated and a current flows therethrough to burn-in the contacts/vias in the first current path. After the first current path allows burn-in testing for a while, the memory cell may be powered off and the burn-in procedure enters step S306. In step S306, a second digital data is stored in the memory cell. In step S308, the bit-line and the bit-line-bar are coupled together, and the word line is set to a specific level to couple the memory cell with the bit-line and the bit-line-bar. Then, a second current path is generated and a current flows therethrough to burn-in the contacts/vias in the second current path. After the second current path allows burn-in testing for a while, the memory cell may be powered off and the total burn-in procedure for the memory cell is completed.

The invention is not limited to burn-in testing of an SRAM and may be further applied in burn-in testing of general chips. For a chip burn-in procedure, several current paths are designed to allow currents to flow through the contacts/vias of the chip. The reliability of the contacts/vias of the tested chip is verified by the currents flowing through the designed current paths.

When the burn-in technique of the invention is applied in testing unpackaged chips, the cost of the chip manufacturing is quiet low since the defected chips are filtered out before being packaged. However, the burn-in technique of the invention is not limited to unpackaged chips and may be further applied in testing packaged chips.

The SRAM burn-in procedure of the invention may be realized after conventional burn-in processes. The conventional burn-in techniques typically test the SRAM circuit by applying severe operation voltages, wherein great voltage levels are applied in the tested chip to verify the robustness of the gate oxide of the SRAM circuit. Meanwhile, the SRAM burn-in procedure of the invention further verifies the robustness of the contacts/vias of the SRAM circuit. The combination of the two burn-in techniques can improve the reliability of manufactured SRAMs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A burn-in method for a static random access memory (SRAM), wherein the SRAM comprises a memory cell, the memory cell comprises a latch and a first and a second transmission gate, the first and second transmission gates are enabled according to a signal on a word line to couple a first and a second terminal of the latch to a bit-line and a bit-line-bar, respectively, and an equalizing circuit is between the bit-line and the bit-line-bar, comprising:
    setting the first and second terminals of the latch to a first and a second state, respectively;
    enabling the equalizing circuit; and
    enabling the first and second transmission gates by enabling the signal on the word line.

2. The burn-in method as claimed in claim 1, further comprising:
    setting the first and second terminals of the latch to the second and first states, respectively;
    enabling the equalizing circuit; and
    enabling the first and second transmission gates by enabling the signal on the word line.

3. The burn-in method as claimed in claim 1, wherein the step of enabling the signal on the word line is realized by setting the signal on the word line to be greater than a threshold voltage of the first and second transmission gates and setting the voltage difference between the signal on the word line and the threshold voltage to be within a predetermined range.

4. The burn-in method as claimed in claim 2, wherein the step of enabling the signal on the word line is realized by setting the signal on the word line to be greater than a threshold voltage of the first and second transmission gates and setting the voltage difference between the signal on the word line and the threshold voltage to be within a predetermined range.

5. The burn-in method as claimed in claim 1, further comprising setting a voltage source of the latch to be greater than a normal operational voltage level thereof.

6. The burn-in method as claimed in claim 2, further comprising setting a voltage source of the latch to be greater than a normal operational voltage level thereof.

7. A burn-in method for a static random access memory (SRAM), wherein the SRAM comprises a memory cell, and the memory cell is coupled to a bit-line and a bit-line-bar according to a signal on a word line, comprising:
    storing a first digital data in the memory cell;
    coupling the bit-line with the bit-line-bar; and
    setting the signal on the word line to couple the memory cell with the bit-line and the bit-line-bar.

8. The burn-in method as claimed in claim 7, further comprising:
    storing a second digital data in the memory cell;
    coupling the bit-line with the bit-line-bar; and
    setting the signal on the word line to couple the memory cell with the bit-line and the bit-line-bar.

* * * * *